United States Patent
Han et al.

(10) Patent No.: US 8,290,661 B2
(45) Date of Patent: *Oct. 16, 2012

(54) SIMULATION TEST SYSTEM AND METHOD FOR TESTING VEHICLE ELECTRONIC COMPONENT

(75) Inventors: Jin Gon Han, Busan (KR); Joon Sang Kim, Incheon (KR); Myung Sung Choi, Ulsan (KR); Sung Hwan Jang, Ulsan (KR)

(73) Assignee: Hyundai Motor Company, Seoul (KR)

( * ) Notice: Subject to any disclaimer, the term of this patent is extended or adjusted under 35 U.S.C. 154(b) by 568 days.

This patent is subject to a terminal disclaimer.

(21) Appl. No.: 12/274,835

(22) Filed: Nov. 20, 2008

(65) Prior Publication Data

US 2009/0157374 A1 Jun. 18, 2009

(30) Foreign Application Priority Data

Dec. 18, 2007 (KR) .................. 10-2007-0133096
Dec. 18, 2007 (KR) .................. 10-2007-0133097

(51) Int. Cl.
*G01M 17/00* (2006.01)
*G06F 19/00* (2011.01)
(52) U.S. Cl. ............. 701/33.4; 701/32.8; 703/8; 703/17
(58) Field of Classification Search ................ 701/1, 29, 701/33–35; 73/118.01–118.04, 114.01–114.81; 324/378–402, 500, 512, 527–533; 360/5; 702/58, 59, 66, 69–74, 183, 185; 703/2–4, 703/8, 13; 714/25, 32, 33, 37, 45
See application file for complete search history.

(56) References Cited

U.S. PATENT DOCUMENTS

| | | | | | |
|---|---|---|---|---|---|
| 3,777,129 | A | * | 12/1973 | Mehta | 716/136 |
| 4,325,251 | A | * | 4/1982 | Kanegae | 73/114.61 |
| 4,631,697 | A | * | 12/1986 | Ferguson | 360/5 |
| 4,996,688 | A | * | 2/1991 | Byers et al. | 714/45 |
| 5,041,976 | A | * | 8/1991 | Marko et al. | 701/29 |
| 5,056,056 | A | * | 10/1991 | Gustin | 702/187 |
| 5,255,208 | A | * | 10/1993 | Thakore et al. | 702/185 |
| 5,307,290 | A | * | 4/1994 | Raviglione et al. | 701/29 |

(Continued)

FOREIGN PATENT DOCUMENTS

KR 10-1998-0030925 7/1998

(Continued)

OTHER PUBLICATIONS

Ramamoorthy, A Structural Theory of Machine Diagnosis, 1967, Proceedings of the Spring Joint Computer Conference (AFIPS Spring '67), pp. 743-756.*

(Continued)

*Primary Examiner* — Thomas G. Black
*Assistant Examiner* — Lindsay M Browder
(74) *Attorney, Agent, or Firm* — Edwards Wildman Palmer LLP; Peter F. Corless

(57) ABSTRACT

Disclosed is a simulation test system and method for testing a vehicle electronic component capable of easily testing performance of the electronic component anytime regardless of location without repeating the same driving test.

13 Claims, 7 Drawing Sheets

U.S. PATENT DOCUMENTS

| | | | | |
|---|---|---|---|---|
| 5,475,624 | A * | 12/1995 | West | 703/15 |
| 5,550,762 | A * | 8/1996 | Doll | 702/183 |
| 5,638,273 | A * | 6/1997 | Coiner et al. | 701/35 |
| 6,052,807 | A * | 4/2000 | Nygaard, Jr. | 714/724 |
| 6,745,151 | B2 * | 6/2004 | Marko et al. | 702/182 |
| 6,768,935 | B1 * | 7/2004 | Morgan et al. | 701/29 |
| 2005/0080606 | A1 * | 4/2005 | Ampunan et al. | 703/8 |
| 2006/0106584 | A1 * | 5/2006 | Oesterling et al. | 703/1 |
| 2007/0260373 | A1 * | 11/2007 | Langer et al. | 701/29 |
| 2007/0260438 | A1 * | 11/2007 | Langer et al. | 703/8 |

FOREIGN PATENT DOCUMENTS

| | | |
|---|---|---|
| KR | 10-2000-0020121 A | 4/2000 |
| KR | 10-2003-0047179 | 6/2003 |
| KR | 10-2006-0008401 | 1/2006 |

OTHER PUBLICATIONS

Witte, "Attenuating Probes", Electronic Test Instruments, 1993, Prentice Hall, Retrieved on May 25, 2011 from http://zone.ni.com/devzone/cda/ph/p/id/17.*

Gühmann, Model-Based Testing of Automotive Electronic Control Units, 2005, Third International Conference on Materials Testing (Test 2005), Retrieved on May 31, 2011 from http://www.mdt.tu-berlin.de/fileadmin/fg184/Lehre/MoSuF/Vorlesung/Vorlesung2_artiekelgueh.pdf.*

Johanson et al., A Framework for Distributed Collaborative Automotive Testing, Apr. 2006, Proceedings of the Challenges in Collaborative Engineering (CCE '06) Workshops, Retrieved on May 31, 2011 from http://w2.alkit.se/~mathias/doc/CCE06_paper.pdf.*

* cited by examiner

SIMULATION TEST SYSTEM AND METHOD FOR TESTING VEHICLE ELECTRONIC COMPONENT

CROSS-REFERENCE TO RELATED APPLICATIONS

This application claims under 35 U.S.C. §119(a) priority to Korean Application No. 10-2007-0133096, filed on Dec. 18, 2007 and Korean Application No. 10-2007-0133097, filed on Dec. 18, 2007, the disclosure of which is incorporated herein by reference in its entirety.

BACKGROUND OF THE INVENTION

1. Technical Field

The present invention relates to a simulation test system and methods for testing a vehicle electronic component, wherein the methods are capable of easily testing the performance of electronic components without repeating the same driving test anytime regardless of location.

2. Related Art

In general, when a new electronic component is developed, whether the electronic component operates without malfunction is preferably tested. For example, after a newly developed vehicle component is mounted on a vehicle, performance of the component or erroneous operation of the component is suitably tested through a vehicle driving test under various conditions.

In the case where it is necessary to perform the performance test on the vehicle electronic component under certain special conditions, for example, conditions that are different from typical road or climate conditions in the country where in the vehicle electronic component was developed (e.g. an overseas region), it can be suitably difficult in that the overseas region with these special conditions must be visited such that a performance test can be performed on the electronic component. Further, such a test is preferably repeated whenever the electronic component is upgraded, which results in considerable cost and inefficiency.

Generally, a test or an error diagnosis of the vehicle electronic component has been performed where an expert senses and notes, for example, an erroneous lighting of a lamp, malfunction of a navigation system, an error or not of an audio system, an erroneous operation of a gear transmission, noise of an engine, and/or erroneous operations of other electronic components depending on his sensation while driving the vehicle.

When an erroneous operation of an electronic component with a plurality of input/output ports such as an airbag control unit (ACU) is detected, it is generally not easy to find that the erroneous operation occurs due to any cause, for example, due to an error of a signal input to any port. Further, when such an erroneous operation is found to occur only under certain specific conditions, then such specific conditions should preferably be reproduced in order to verify whether a defect related to the erroneous operation is suitably removed, even in a case where the related electronic component is improved. Accordingly, the vehicle driving test should be repeated under the same driving conditions as prior conditions and on the same road as a prior road, which requires a considerable effort and cost.

The above information disclosed in this the Background section is only for enhancement of understanding of the background of the invention and therefore it may contain information that does not form the prior art that is already known in this country to a person of ordinary skill in the art.

SUMMARY OF THE INVENTION

The present invention provides a simulation test system and methods for testing a vehicle electronic component capable of easily performing a test for performance of electronic components and an error diagnosis test without repeating the same driving test regardless of location.

In preferred embodiments, the present invention provides a simulation test system and a method capable of being used for performance improvement of components using an unusual waveform that leads to an erroneous operation of electronic components.

In accordance with a preferred aspect of the present invention, there is provided a simulation test system for a vehicle electronic component comprising at least one attenuation probe that is connected to input lines of operating sample components in a state where they are electrically connected to the vehicle; a data collector that has multi-channels connectable to the attenuation probe at a ratio of 1:1 and periodically stores input and output waveforms input in real time through the multi-channels, together with a sampling time and channel information for each waveform; a waveform generator that not only reproduces the obtained waveform data into original waveforms through the multi-channels using the data collector but also synchronously reproduces the waveforms for each channel; and an amplifier that amplifies the waveforms reproduced in the waveform generator.

According to another preferred aspect of the present invention, there is provided a simulation test method for a vehicle electronic component comprising a plurality of input and output ports, preferably comprising (a) a process sharing, through a communication network, a database where waveform data for at least one sample component is sorted according to at least test conditions, wherein the waveform data are suitably obtained in real time by a process collecting at least input waveforms of operating sample components electrically connected to the vehicle that are input to the input ports while driving the vehicle under specific test conditions, wherein the specific test conditions include at least one of a road on which the driving test is performed, a region, a climate, and driving conditions; and (b) a process testing a state of the tested components by obtaining the specific waveform data in the database, suitably reproducing the obtained waveform data into the original input waveforms, and inputting the reproduced waveforms to the input ports of the tested components.

In preferred embodiments, the database may include unusual waveform data of at least one sample component, the unusual waveform data being suitably obtained through at least one of: (c-1) a process simultaneously collecting the input and output waveforms of the operating sample component in real time in the state where they are electrically connected to the vehicle; (c-2) a process obtaining the sample component information on a point in time of generation of the unusual output waveforms causing the erroneous operation of the sample components by analyzing the output waveforms; and (c-3) a process extracting the input waveforms during a predetermined time after and before the point in time generating the unusual output waveforms using the information on the point in time.

Preferably, in the process (c-1), the input and output waveforms may be suitably collected through attenuation probes that are connected to each of the input and output lines electrically connecting the vehicle to the sample components; and in the process (b), the unusual waveform data are reproduced and amplified through the waveform generator and are then input to the input ports.

Preferably, in the process (b), the unusual waveform data may be suitably reproduced into the original waveforms through the waveform generator having the multi-channels.

Preferably, in the process (c-1), the input and output waveforms may be suitably collected from all the input and output lines that connect the input and output ports of the sample components to the vehicle.

Preferably, in the process (c-1), the input and output waveforms may be suitably collected through the data collector preferably configured to sample the waveforms in real time through the multi-channels, add the sampling time and the channel information for each waveform to the sampled waveforms, and periodically store them.

In preferred embodiments, according to the simulation test system and method for testing an electronic component as described above, normal and abnormal (i.e. unusual) waveform data, which are preferably sampled from sample electronic components operated under various conditions, are stored in a database and shared on a network to allow downloading of the required waveform data anytime regardless of location, such that it can easily be used for performance tests and performance improvement of the same electronic components.

In further embodiments, the present invention copies preferably used with complications caused by several unusual waveforms.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum).

As referred to herein, a hybrid vehicle is a vehicle that has two or more sources of power, for example both gasoline-powered and electric-powered.

The above features and advantages of the present invention will be apparent from or are set forth in more detail in the accompanying drawings, which are incorporated in and form a part of this specification, and the following Detailed Description, which together serve to explain by way of example the principles of the present invention.

BRIEF DESCRIPTION OF THE DRAWINGS

These and other objects, features, and advantages of preferred embodiments of the present invention will be more fully described in the following detailed description, taken in conjunction with the accompanying drawings. In the drawings.

DESCRIPTION

In a first aspect, the invention features a simulation test system for a vehicle electronic component preferably comprising at least one attenuation probe, a data collector that has multi-channels connectable to the attenuation probe and that periodically stores input and output waveforms for each waveform, a waveform generator, and an amplifier.

In one embodiment, at least one attenuation probe is connected to input lines of operating sample components in a state where they are electrically connected to the vehicle.

In another embodiment, the multi-channels are connectable to the attenuation probe at a ratio of 1:1.

In still another embodiment, the data collector periodically stores input and output waveforms input in real time through the multi-channels, together with a sampling time and channel information for each waveform.

In another further embodiment, the waveform generator reproduces the obtained waveform data into original waveforms. In a related embodiment, the waveform generator synchronously reproduces the waveforms for each channel. In still another related embodiment, the waveform generator reproduces the obtained waveform data into original waveforms through the multi-channels using the data collector.

In another embodiment, the amplifier amplifies the waveforms reproduced in the waveform generator.

In another aspect, the invention features a motor vehicle comprising the simulation test system for a vehicle electronic component as described in any one of the aspects herein.

Hereinafter, a preferred simulation test system and method for testing a vehicle electronic component according to the present invention will be described with reference to the accompanying drawings.

Figure 1:
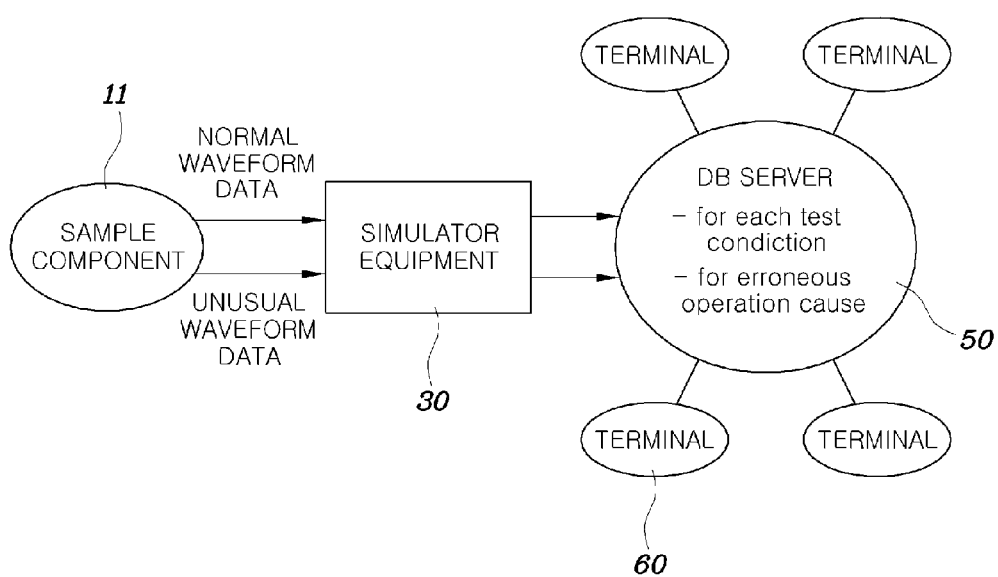
FIG. 1 is an exemplary view of a system and method according to preferred embodiments of the present invention.

Referring to FIG. 1, according to preferred embodiments of the present invention, normal or unusual waveform data, which are preferably collected from various sample components 11 by a simulator equipment 30, are suitably stored in a DB server 50 accessible from a remote terminal 60. The waveform data of the DB server 50 is classified and stored according to the test conditions and erroneous operation causes of components so that they can easily be searched. Accordingly, an examiner or a diagnostician may preferably download specific waveform data required in the DB server 50 without actually performing a driving test on a vehicle, making it possible to suitably perform a performance test on the vehicle electronic component.

Figure 2:
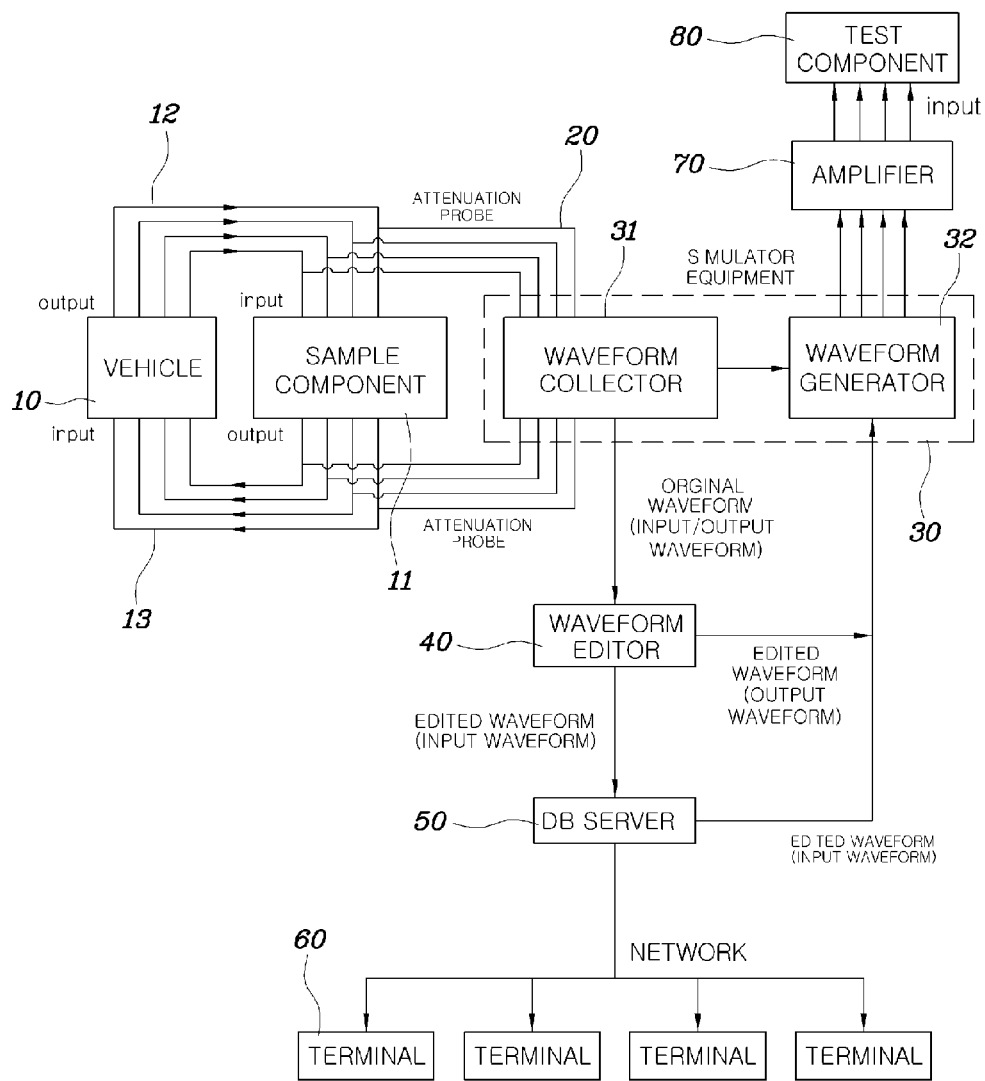
FIG. 2 is a schematic view showing one preferred example of a configuration of a system that performs a method for diagnosing an error of a vehicle electronic component according to the present invention.

First, in one preferred embodiment, a configuration of a simulation test system and method for testing a vehicle electronic component according to a preferred embodiment of the present invention will be described with reference to exemplary FIG. 2. As shown in FIG. 2, in preferred embodiments, the system comprises, but is not limited to, attenuation probes 20, a waveform collector 31, a waveform generator 32, and an amplifier 70, as a means that suitably collects and reproduces waveforms, a waveform editor 40 as a means that suitably extracts, stores in database and shares required waveforms from the collected waveforms, and a DB server 50 accessible from remote terminals 60. In other preferred embodiments, the waveform collector 31 and the waveform generator 32 are preferably constituted to be incorporated into a single piece of simulator equipment 30 with a portable size. In preferred embodiments, the waveform collector 31, which preferably has a kind of digital scope function and record function, receives and stores input/output waveforms from a sample component 11 mounted in a vehicle 10 in real time using a plurality of attenuation probes 20, for example, but not only limited to, 100:1 probes. Since it is difficult to obtain the waveforms directly from input/output ports of the sample component 11 in operation, the waveforms are preferably collected by connecting the attenuation probes 20 to each of a power supply and input/output signal lines (commonly referred to as input/output lines 12 and preferably 13) connecting the vehicle 10 and the sample component 11.

In further preferred embodiments, such a waveform collector preferably 31 needs to have several tens of channels, preferably the channels having a sampling rate of 100 MS/s, a resolution of 14 bits, and a bandwidth of 100 MHz, and in other further embodiments, uses a PCI (Peripheral Component Interconnect) express link capable of suitably performing data streaming of 1 GB/s and preferably, in still other further embodiments, a PXI (PCI Extensions for Instrumentation) express link as a data bus. In other embodiments, the wave collector 31 preferably uses a storage with a TB-grade of capacity preferably capable of writing data of 600 Mb per second as a storage, and preferably uses a Redundant Array of Inexpensive Disks (RAID) as a storing scheme. In other further embodiments, the wave collector uses a CPU of a Dual Core or an Octa Core or more as a CPU.

In further embodiments of the invention as described herein, the waveform editor 40 is preferably used for editing of original waveform data collected in the waveform collector 31, and further for the detection of an unusual waveform, suitably through an analysis of the waveform data, etc. Preferably, such a waveform editor 40 is suitably equipped with a PC operating-based dedicated analysis tool in order to easily extract only a required portion of the original waveform data or easily analyze the original waveform data.

According to other preferred embodiments, the DB server 50 stores the edited waveform data generated in the waveform editor 31. Preferably, such a DB server 50 is suitably network-connected to the remote terminals 60. In further embodiments, the edited waveform data are sorted and stored preferably according to a predetermined rule so that users accessing the DB server 50 through the remote terminals 60 may easily find and download necessary waveform data. In other preferred embodiments, the edited waveform data may be sorted according, but not limited to, for example, types of erroneous operation causes of the electronic component from which the waveform data are obtained, a road on which the driving test is performed, a region, a climate, driving conditions, etc.

Preferably, the waveform generator 32 is used to reproduce the edited waveform data stored in the DB server 50 into analog waveforms. In further embodiments, the waveforms reproduced in the waveform generator 32 are suitably output to input ports of a test component 80, which, according to other further embodiments, is the same kind as the sample component 11. Accordingly, the waveform generator 32 needs to have at least several tens of channels as in the waveform collector 31, and the waveforms output through these channels need to be suitably synchronized. In certain preferred embodiments, such a waveform generator 32 has a resolution of 16 bits and sampling rate of 200 MS/s, and suitably requires a PCI-based PXI express link as a data bus. In certain exemplary embodiments, a waveform generator such as a PXI-5422 product obtainable from National Instrument, Inc., may be used, although not limited to such.

In other embodiments of the invention, the amplifier 70 is used to again amplify the waveforms suitably reproduced in the waveform generator 32 to reproduce the waveforms into the same waveforms as the original waveforms collected from the waveform collector 31. Preferably, the waveforms amplified in this amplifier 70 are suitably output to the input ports of the test component 80.

The simulation test method for the vehicle electronic component according to preferred embodiments of the invention, and using the system as described above will be described.

(i) First, in one embodiment, the waveform data are suitably collected. As shown in exemplary FIG. 2, the sample components 11 are preferably simultaneously collected in real time from the input/output lines 12 and 13 mutually electrically connecting the vehicle and the sample component 11 through the attenuation probes 20, while suitably driving the vehicle 10 in which the sample component 11 is mounted. The tested sample component 11 may be, for example, normally operated standardized components or problematic components that are abnormally operated and need to be improved, according to kinds of waveforms to be suitably obtained. Preferably, in order to easily extract the unusual waveform and facilitate the test on the performance and the unusual diagnosis of the sample component, the input and output waveforms are preferably collected from all the input/output lines 12 and 13 of the sample component 11. According to related embodiments, only the input waveforms may be collected so as to suitably collect the normal waveform data. In further embodiments, whether or not the collected input waveforms cause the erroneous operation of the sample component should be verified. Accordingly, it is preferable to collect all the input and output waveforms in any case. In other embodiments, the waveform data input to the waveform collector 31 are periodically stored together with sampling time and channel information in the storage, for example, they are cut and stored by a sampling amount during one minute in the storage. Preferably, the channel information is channel information of the waveform collector 31 to which any waveform is input and at the same time, is information of the input/output ports of the sample component 11 of which the corresponding waveform is collected. The waveform collector 31 and the waveform generator 32 are constituted to be suitably incorporated into the simulator equipment 30 with the portable size.

(ii-1) In further preferred embodiments of the invention described herein, the unusual waveform data are extracted from the collector waveform data. Preferably, when only the input waveforms are collected, the extraction of the unusual waveform data is unnecessary. Preferably, the unusual waveform data may be extracted by obtaining information on a point in time of generation of the unusual output waveform that causes the erroneous operation of the sample component 11 through analysis of the output waveforms among the collected waveform data and then extracting input waveforms during a predetermined time before and after the point in time of generation of the unusual output waveform using the information on the point in time. Preferably, the point in time generation of the unusual output waveform may be suitably obtained by setting a reference value (see FIGS. 6A and 6B) over which the erroneous operation is expected to be generated, in view of characteristics of the sample component 11 and checking the point in time of generation of an output waveform with waveform variation above the reference value using the waveform editor 40. Accordingly, since sampling time information on the input and output waveforms is known, it is possible to extract input waveforms input to the sample component 11 before and after the point in time of generation of this output waveform. Such extracted input waveforms (original waveforms) are edited (edited waveforms), for example, added or cut, etc., for capacity reduction. In other embodiments, whether or not the obtained input waveforms really cause the erroneous operation in the sample component 11 may be immediately confirmed by inputting the corresponding unusual input waveforms to the input port of the sample component 11. Accordingly, in the case where there is no the erroneous operation of the sample component 11 in the above-mentioned process, all the input waveforms input to the sample component 11 are normal waveforms, such that the thus obtained normal waveform data are classified and stored in database according to the kind of the tested component, the test condition (road, geographical region, weather, driving, etc.).

Figure 3:
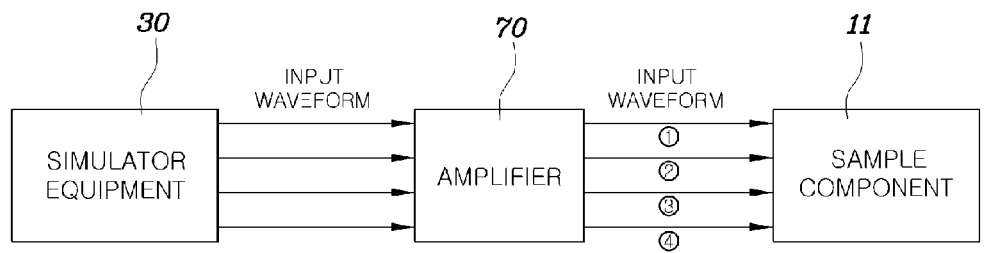
FIG. 3 is an exemplary schematic view explaining one example of a method for analyzing causes of an erroneous operation of an electronic component according to the present invention.
Figure 4:
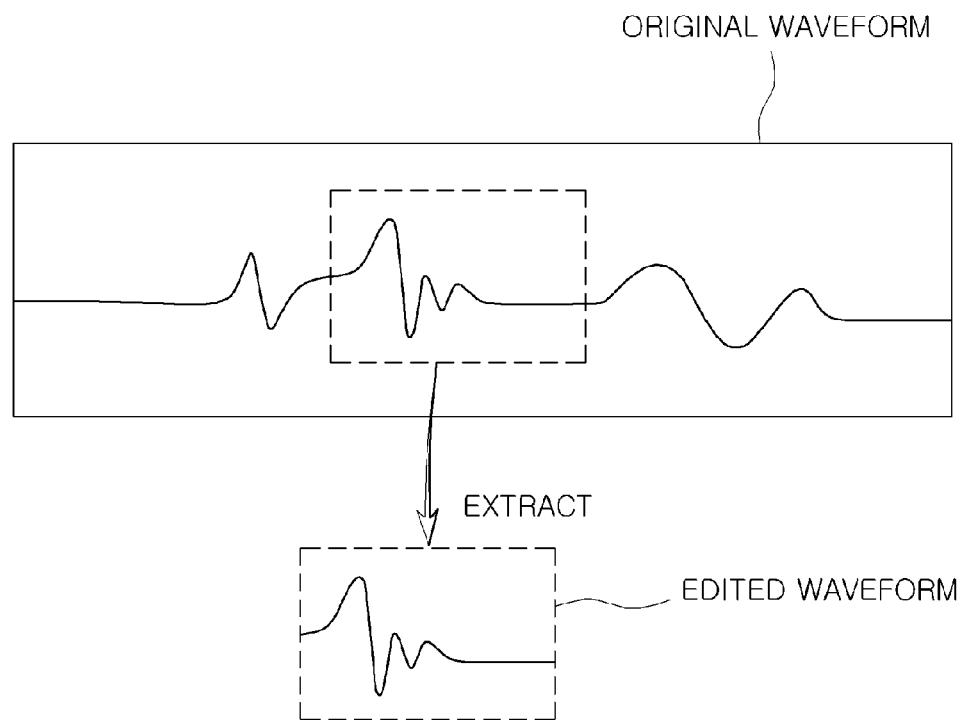
FIG. 4 is an exemplary view showing one example of an edited waveform according to the present invention.

(ii-2) The unusual waveform data stated in the (ii-1) process is, for example, a bundle of the input waveforms input to all the input ports of the sample component 11. Therefore, in order to accurately reveal the cause of the erroneous operation of the sample component 11, it is required to confirm which one out of the input waveforms to which input port of the sample component 11 causes the erroneous operation, and to extract it. Referring to FIG. 3, in a cause analysis of the erroneous operation, an unusual waveform data (a bundle of the input waveforms) is output to the sample component 11 using the simulator equipment 30 having the waveform generator 31 and the amplifier 70. More concretely, the analysis may be made in a scheme that the unusual waveform data is repeatedly output to the sample component 11 as disconnecting connections between ports of the sample component 11 and the amplifier 70 one by one (refer to the sequence of ①→②→③→④ shown in FIG. 3) and confirming whether the erroneous operation of the sample component 11 occurs or not, each time the output of the unusual waveform data is repeated. As shown in FIG. 3, the unusual input waveform (original waveform) obtained with such a scheme is edited (edited waveform) in an appropriate size. To remove the erroneous operation of the sample component, it is necessary to remove the cause itself generating such an unusual input waveform. If the unusual input waveform is inevitable, however, the electronic component is controlled so as not to be erroneously operated by the unusual input waveform (that is, the electronic component is re-designed to ignore the unusual input waveform).

(iii) In other further preferred embodiments of the invention described herein, the normal and unusual waveform data (edited waveform) extracted as described above are suitably shared. Preferably, the share may be made in various schemes such as a scheme that a database of the normal and unusual waveform data is built up to be uploaded to the DB server 50 accessible through the communication network, etc., although any suitable scheme is possible.

Figure 5A:
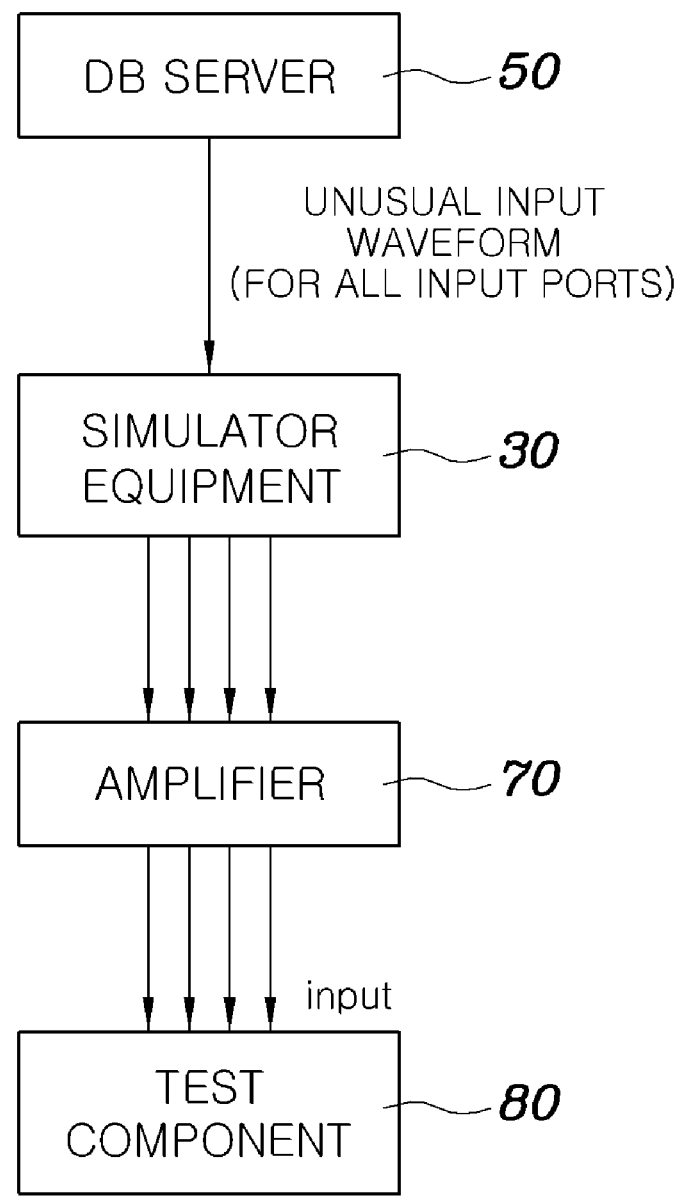
FIG. 5A is an exemplary schematic view explaining one example of a method for confirming an erroneous operation or not of an electronic component according to the present invention.
Figure 5B:
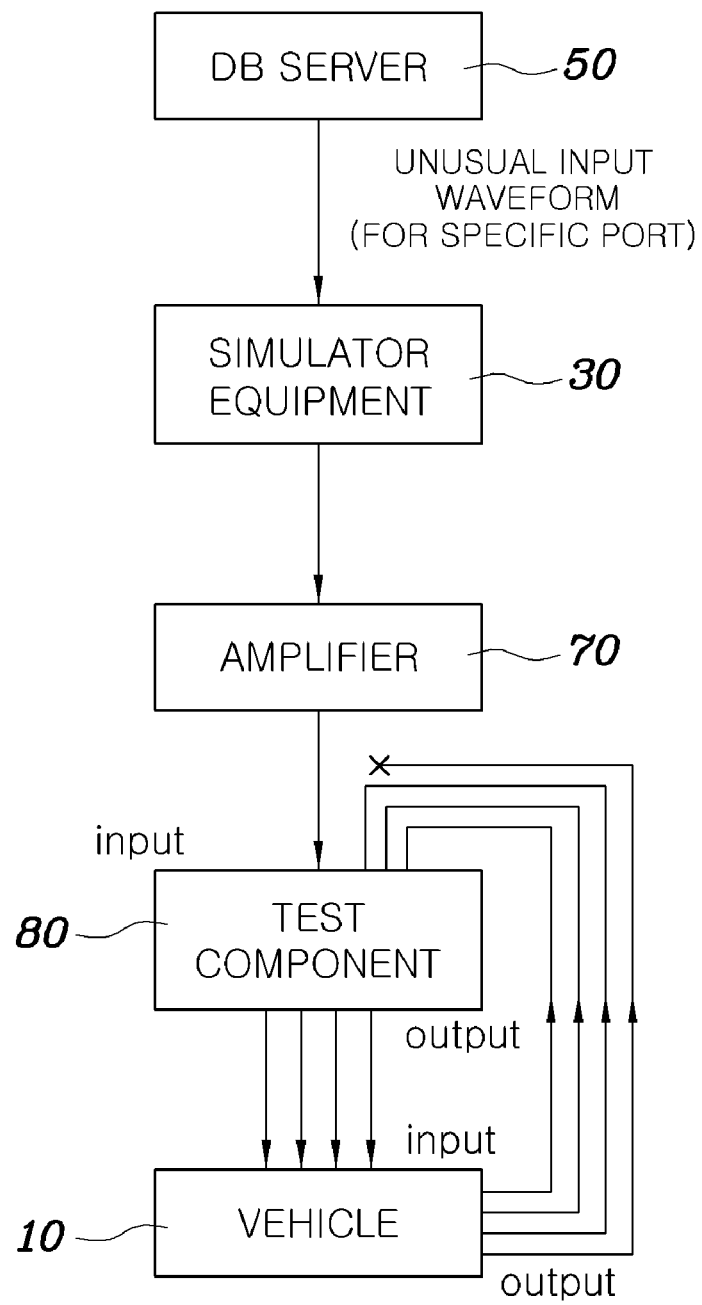
FIG. 5B is an exemplary schematic view explaining another example of a method for confirming an erroneous operation or not of an electronic component according to the present invention.

(iv) In further preferred embodiments of the invention described herein, the unusual and normal waveform data shared on the DB server 50 are suitably obtained so that the performance and erroneous operation or not of the test component 11 is preferably tested using the simulator equipment 30 and the amplifier 70. In further embodiments, this test may be made by two methods shown in FIGS. 5A and 5B, for example. First, referring to FIG. 5A, the erroneous operation or not of the test component 80 may preferably be tested by reproducing the normal or unusual waveform data extracted in the (ii-1) process into the original input waveforms (the input waveforms input to all the input ports of the sample component) and inputting the original input waveforms to the input ports of the test component. Referring to FIG. 5B, the erroneous operation or not of the test component 80 may also be tested by reproducing the unusual waveform data extracted in the (ii-2) process into an original input waveform (an input waveform input to a particular input port of the sample component) and inputting the original input waveform to the particular input port of the test component in operation. According to further preferred embodiments, signals from the vehicle are suitable input to input ports of test component 80 other than the corresponding input ports. As such, it is possible to diagnose the error of the electronic component by the simulation without requiring an actual driving test.

Figure 6A:
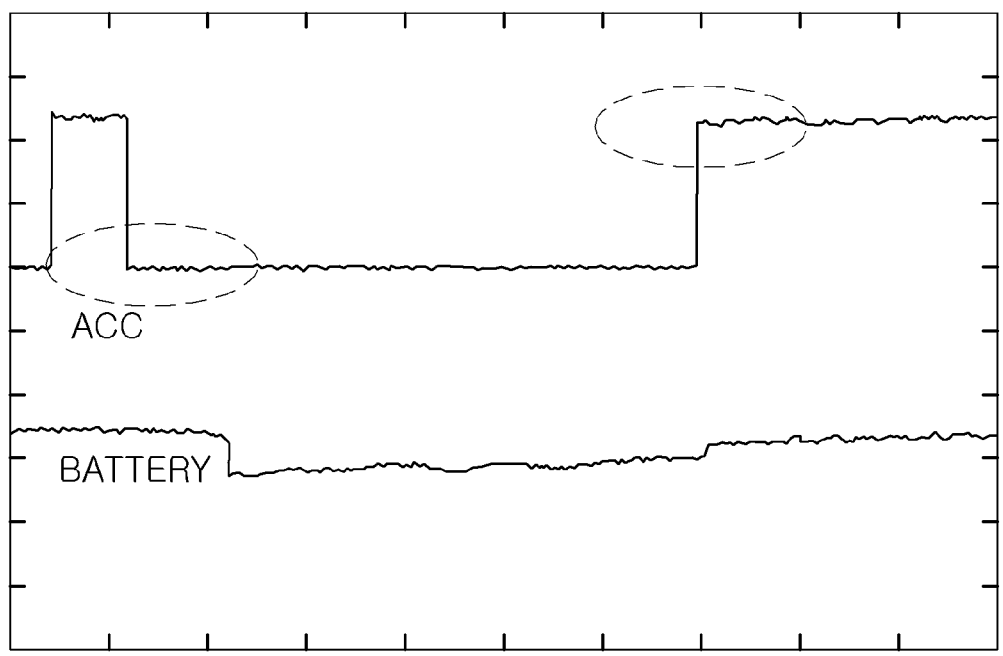
FIG. 6A is an exemplary view showing examples of normal input waveforms.
Figure 6B:
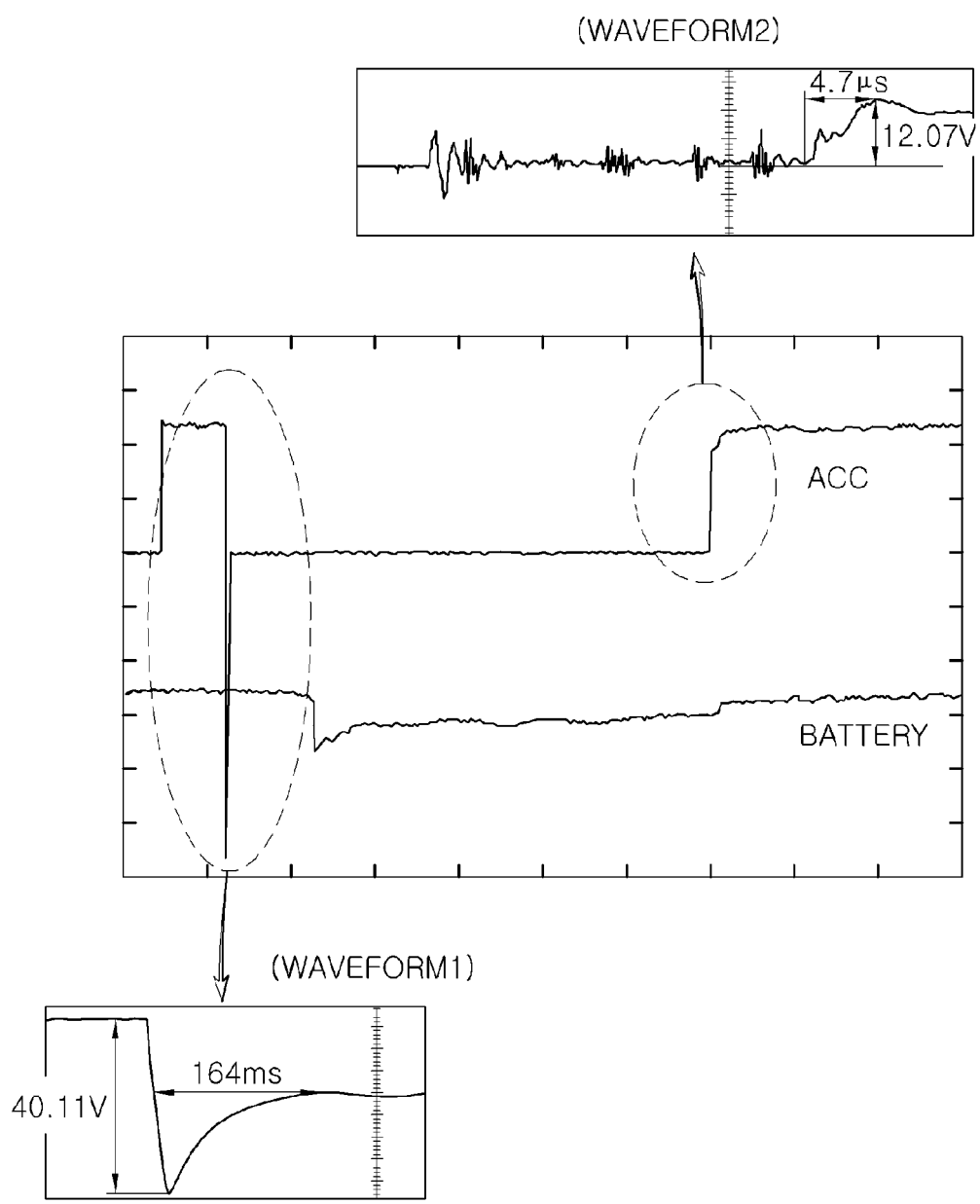
FIG. 6B is an exemplary view showing examples of abnormal input waveforms for comparison with the input waveforms shown in FIG. 5A.

Referring to FIGS. 6A and 6B, preferred examples of the unusual waveforms that may cause the erroneous operation of the electronic component will be described. Exemplary embodiments of normal input waveforms input to a battery and an ACC are shown in FIG. 6A. An exemplary embodiment in which the input waveform preferably input to the ACC is considered unusual due to a momentary power supply variation is shown in FIG. 6B. In FIG. 6B, [waveform 1] and [waveform 2] are enlarged waveforms of the waveforms input to the ACC, respectively. [Waveform 1] is a waveform having a voltage variation of 40.11V generated for 164 ms and this degree of voltage variation may cause erroneous operation of the ACC. [waveform 2] is a waveform having a relatively low voltage variation of 12.07V generated for relatively short time of 4.7 μs and the ACC may not be erroneously operated by this degree of voltage variation. An expert can detect and extract these kinds of unusual waveforms using a voltage variation thereof.

Although the present invention has been described in detail with reference to its presently preferred embodiment, it will be understood by those skilled in the art that various modifications and equivalents can be made without departing from the spirit and scope of the present invention, as set forth in the appended claims.

What is claimed is:

1. A simulation test system for a vehicle electronic component comprising:
   at least one attenuation probe that is connected to input lines of operating sample components in a state where they are electrically connected to the vehicle;
   a simulation unit including
      a data collector that has multi-channels connectable to the attenuation probe and periodically stores and classifies input and output waveforms input in real time through the multi-channels, together with a sampling time and channel information for each waveform wherein the waveforms are classified based on at least road conditions at the time the waveform was generated, and
      a waveform generator, in communication with the data collector, that not only reproduces selected waveform data into original waveforms through the multi-channels using the waveform data stored by the data collector but also synchronously reproduces the waveforms for each channel; and
   an amplifier configured to amplify the waveforms reproduced in the waveform generator and input the amplified waveforms into a test component to simulate one or more driving conditions, wherein waveforms are searchable based on at least the associated road conditions at the time the waveform was generated.

2. A simulation test method for a vehicle electronic component comprising a plurality of input and output ports, comprising:
(a) a process sharing, through a communication network, a database where waveform data for at least one sample component is sorted and classified according to at least test conditions, and are then periodically stored wherein the waveform data are obtained in real time by a process collecting by a data collector in a simulation unit, at least input waveforms of operating sample components are electrically connected to the vehicle that are input to the input ports while driving the vehicle under specific test conditions, wherein the specific test conditions include at least one of a road on which the driving test is performed, a region, a climate, and driving conditions, and the waveforms are classified based on at least road conditions at the time the waveform was generated; and
(b) a process testing a state of the tested components by obtaining, by a waveform generator in the simulation unit, the specific waveform data in the database collected during process sharing, reproducing selected waveform data collected during the process sharing into the original input waveforms, and inputting the reproduced waveforms to the input ports of the tested components, wherein waveforms are searchable based on at least the associated road conditions at the time the waveform was generated.

3. The simulation test method of claim 2, wherein the database includes unusual waveform data of at least one sample component, the unusual waveform data being obtained through at least one of:
(c-1) a process simultaneously collecting the input and output waveforms of the operating sample component in real time in the state where they are electrically connected to the vehicle;
(c-2) a process obtaining the sample component information on a point in time of generation of the unusual output waveforms causing the erroneous operation of the sample components by analyzing the output waveforms; and
(c-3) a process extracting the input waveforms during a predetermined time after and before the point in time generating the unusual output waveforms using the information on the point in time.

4. The simulation test method of claim 3, wherein in the process (c-1), the input and output waveforms are collected through attenuation probes that are connected to each of the input and output lines electrically connecting the vehicle to the sample components; and
in the process (b), the unusual waveform data are reproduced and amplified through the waveform generator and are then input to the input ports.

5. The simulation test method of claim 4, wherein in the process (b), the unusual waveform data are reproduced into the original waveforms through the waveform generator having the multi-channels.

6. The simulation test method of claim 3, wherein in the process (c-1), the input and output waveforms are collected from all the input and output lines that connect the input and output ports of the sample components to the vehicle.

7. The simulation test method of claim 3, wherein in the process (c-1), the input and output waveforms are collected through the data collector configured to sample the waveforms in real time through the multi-channels, add the sampling time and the channel information for each waveform to the sampled waveforms, and periodically store them.

8. A simulation test system for a vehicle electronic component comprising:
at least one attenuation probe;
a simulation unit in communication with the at least one attenuation probe, the simulation unit including:
a data collector having multi-channels connectable to the attenuation probe and that periodically stores and classifies input and output waveforms for each waveform wherein the waveforms are classified based on at least road conditions at the time the waveform was generated;
a waveform generator, in communication with the data collector, that not only reproduces the obtained selected waveform data into original waveforms through the multi-channels using the waveform data stored by the data collector but also synchronously reproduces the waveforms for each channel; and
an amplifier configured to amplify the waveforms reproduced in the waveform generator and input the amplified waveforms into a test component to simulate one or more driving conditions, wherein waveforms are searchable based on at least the associated road conditions at the time the waveform was generated.

9. The simulation test system for a vehicle electronic component of claim 8, wherein the at least one attenuation probe is connected to input lines of operating sample components in a state where they are electrically connected to the vehicle.

10. The simulation test system for a vehicle electronic component of claim 8, wherein the multi-channels are connectable to the attenuation probe at a ratio of 1:1.

11. The simulation test system for a vehicle electronic component of claim 8, wherein the data collector periodically stores input and output waveforms input in real time through the multi-channels, together with a sampling time and channel information for each waveform.

12. A motor vehicle comprising the simulation test system for a vehicle electronic component of claim 1.

13. A motor vehicle comprising the simulation test system for a vehicle electronic component of claim 8.

* * * * *